United States Patent
Xu

(10) Patent No.: US 12,210,704 B2
(45) Date of Patent: Jan. 28, 2025

(54) DISPLAY PANEL WITH TOUCH PINS AND TEST PINS

(71) Applicant: WUHAN CHINA STAR OPTOELECTRONICS SEMICONDUCTOR DISPLAY TECHNOLOGY CO., LTD., Hubei (CN)

(72) Inventor: Zuzhao Xu, Hubei (CN)

(73) Assignee: Wuhan China Star Optoelectronics Semiconductor Display Technology Co., Ltd., Hubei (CN)

( * ) Notice: Subject to any disclaimer, the term of this patent is extended or adjusted under 35 U.S.C. 154(b) by 0 days.

(21) Appl. No.: 17/611,556

(22) PCT Filed: Sep. 6, 2021

(86) PCT No.: PCT/CN2021/116636
§ 371 (c)(1),
(2) Date: Feb. 2, 2023

(87) PCT Pub. No.: WO2023/004932
PCT Pub. Date: Feb. 2, 2023

(65) Prior Publication Data
US 2024/0045545 A1    Feb. 8, 2024

(30) Foreign Application Priority Data

Jul. 30, 2021   (CN) .................. 202110868268.7

(51) Int. Cl.
*G06F 3/041*   (2006.01)
*G01R 31/28*   (2006.01)
(Continued)

(52) U.S. Cl.
CPC ....... *G06F 3/0418* (2013.01); *G01R 31/2891* (2013.01); *G06F 3/0412* (2013.01);
(Continued)

(58) Field of Classification Search
CPC .. G06F 3/0418; G06F 3/0446; G06F 3/04164; G06F 3/0412; G06F 3/041–047;
(Continued)

(56) References Cited

U.S. PATENT DOCUMENTS

2006/0028232 A1* 2/2006 Yu ............... G02F 1/133351
                                                    324/760.01
2018/0336809 A1* 11/2018 Xi ..................... G09G 3/20
(Continued)

FOREIGN PATENT DOCUMENTS

CN    105093025 A    11/2015
CN    106997249 A  *  8/2017  ........... G01R 31/025
(Continued)

OTHER PUBLICATIONS

International Search Report in International application No. PCT/CN2021/116636, mailed on Apr. 25, 2022.
(Continued)

*Primary Examiner* — Benjamin C Lee
*Assistant Examiner* — Nathan P Brittingham
(74) *Attorney, Agent, or Firm* — PV IP PC; Wei Te Chung

(57) ABSTRACT

The present invention provides a display panel including a display area and a terminal area adjacent to each other, the terminal area includes a driving chip area bonded with a driving chip, a plurality of touch leads are provided in the driving chip area, first ends of the plurality of touch leads are electrically connected to a plurality of touch electrodes in the display area, and a plurality of test pins is electrically connected to second ends of the plurality of touch leads and used for transmitting a test signal are also located in the driving chip area.

12 Claims, 7 Drawing Sheets

(51) Int. Cl.
  *G06F 3/044* (2006.01)
  *G09G 3/20* (2006.01)
  *H01L 27/12* (2006.01)
(52) U.S. Cl.
  CPC ........ *G06F 3/04164* (2019.05); *G06F 3/0446* (2019.05); *G09G 3/20* (2013.01); *H01L 27/1244* (2013.01); *G09G 2300/0413* (2013.01); *G09G 2310/0297* (2013.01)
(58) Field of Classification Search
  CPC ..... G06F 2203/04101–04114; G01R 31/2891; G09G 3/20; G09G 2300/0413; G09G 2310/0297; G09G 3/006; G09G 2330/12; H01L 27/1244
  See application file for complete search history.

(56) References Cited

U.S. PATENT DOCUMENTS

| | | | |
|---|---|---|---|
| 2019/0096978 A1* | 3/2019 | Jung | G09G 3/3275 |
| 2020/0235478 A1* | 7/2020 | Kitamura | H01Q 9/0457 |
| 2021/0287587 A1* | 9/2021 | Park | G09G 3/3275 |
| 2022/0013050 A1* | 1/2022 | Yang | G09G 3/20 |
| 2022/0408548 A1* | 12/2022 | Niu | H05K 1/189 |

FOREIGN PATENT DOCUMENTS

| | | | |
|---|---|---|---|
| CN | 108874236 A | | 11/2018 |
| CN | 111696460 A | | 9/2020 |
| CN | 112071253 A | | 12/2020 |
| CN | 112684945 A | * | 4/2021 |
| CN | 113076028 A | | 7/2021 |
| KR | 20180069365 A | | 6/2018 |

OTHER PUBLICATIONS

Written Opinion of the International Search Authority in International application No. PCT/CN2021/116636, mailed on Apr. 25, 2022.

Chinese Office Action issued in corresponding Chinese Patent Application No. 202110868268.7 dated Jun. 30, 2022, pp. 1-9.

* cited by examiner

DISPLAY PANEL WITH TOUCH PINS AND TEST PINS

FIELD OF INVENTION

The present application relates to the display technology field, and more particularly to manufacture of a display device, and specifically to a display panel.

BACKGROUND OF INVENTION

A self-capacitive touch display panel has characteristics of a small overall thickness and compactness. Each sensing block receives or transmits a touch signal through wires to implement a touch function.

At present, in SDOT (self-capacitance Direct On Cell Touch, self-capacitance oncell touch display screen) products, due to a self-capacitive touch mode, a number of wires connecting multiple touch electrodes in the panel is larger, and a larger number of wires cannot be directly arranged in a wiring area to load test signals. Therefore, there is no touch test schemes for current SDOT products, resulting in a lower yield of products and increased cost of the products.

Therefore, it is necessary to provide a display panel that enables a touch test of SDOT panels to improve product yield and reduce product cost.

SUMMARY OF INVENTION

Technical Problem

It is an object of the present invention to provide a display panel, which solves a problem in the prior art that due to a limited size of a wiring area of the panel, a larger number of wires cannot be directly arranged in the wiring area to load test signals, and thus a touch test cannot be performed.

Technical Solution

A display panel is provided by an embodiment of the present invention, the display panel comprises a display area and a terminal area at least on a side of the display area, the terminal area comprises a driving chip area bonded with a driving chip, and a wiring area around the driving chip area, the display area is provided with:
  a plurality of touch leads and a plurality of touch electrodes, wherein first ends of the plurality of touch leads are electrically connected to the plurality of touch electrodes;
  the driving chip area is provided with:
  a plurality of test pins used for transmitting a test signal, and electrically connected to second ends of the plurality of touch leads to transmit the test signal to the plurality of touch electrodes, and
  the wiring area is provided with:
  a plurality of first control pins used for transmitting a first control signal; and
  a plurality of positioning marks located on sides of the plurality of first control pins away from the plurality of test pins and used for locating the plurality of first control pins and a plurality of probes.

In an embodiment, the plurality of touch leads are arranged in a first direction, the plurality of test pins are arranged in the first direction, and the first direction is parallel to a side of the display area close to the driving chip area.

In an embodiment, the driving chip area is further provided with:
  a multiplexing circuit comprising a plurality of multiplexing input terminals and a plurality of multiplexing output terminals;
  wherein the number of the multiplexing input terminals is less than the number of the multiplexing output terminals, the plurality of multiplexing input terminals and the plurality of test pins are in one-to-one correspondence, the plurality of multiplexing output terminals and the plurality of touch leads are in one-to-one correspondence, each of the plurality of multiplexing input terminals is electrically connected to a corresponding test pin, and each of the plurality of multiplexing output terminals is electrically connected to a corresponding touch lead.

In an embodiment, the multiplexing circuit is positioned between the plurality of test pins and the plurality of touch leads, the plurality of multiplexing input terminals are arranged in the first direction, and the plurality of multiplexing output terminals are arranged in the first direction.

In an embodiment, the multiplexing circuit further comprises:
  a plurality of control terminals electrically connected to the plurality of first control pins to transmit the first control signal to the plurality of control terminals to control a turned on state between the plurality of multiplexing input terminals and the plurality of multiplexing output terminals.

In an embodiment, the wiring area is further provided with:
  a plurality of second control pins for transmitting a second control signal, and
  wherein the plurality of second control pins are in one-to-one correspondence with the plurality of first control pins, and each of the plurality of second control pins is electrically connected to a corresponding first control pin to transmit the second control signal to the plurality of control terminals to electrically disconnect the plurality of multiplexing input terminals and the plurality of multiplexing output terminals.

In an embodiment, the driving chip area is further provided with:
  a plurality of dummy pins located on a side of the plurality of test pins and a side of the multiplexing circuit which are close to the plurality of first control pins, the plurality of dummy pins are arranged in a second direction perpendicular to the first direction, and
  wherein a connection line connected to one of the control terminals, and a corresponding first control pin is provided between two adjacent dummy pins.

In an embodiment, the plurality of first control pins are arranged in the first direction, a symmetry axis of the plurality of first control pins in the first direction coincides with a symmetry axis of the plurality of test pins in the first direction.

In an embodiment, the driving chip area is further provided with:
  a plurality of touch pin groups, wherein each of the plurality of touch pin groups comprises a plurality of touch pins for transmitting a touch signal, and
  wherein the plurality of touch pins and the plurality of touch leads are in one-to-one correspondence, and the plurality of touch pins are electrically connected to second ends of the plurality of touch leads to transmit the touch signal to the plurality of touch electrodes.

In an embodiment, the driving chip area is further provided with:
a plurality of data pin groups, each of the plurality of data pin groups comprises a plurality of data pins for transmitting a data signal;
wherein the plurality of data pin groups and the plurality of touch pin groups are alternately arranged in the first direction, and the plurality of data pin groups and the plurality of touch pin groups are bonded to a same driving chip to perform a transmission of the touch signal and the data signal.

A display panel is provided by an embodiment of the present invention, the display panel comprises a display area and a terminal area at least on a side of the display area, the terminal area comprises a driving chip area bonded with a driving chip, the display area is provided with:
a plurality of touch leads and a plurality of touch electrodes, wherein first ends of the plurality of touch leads are electrically connected to the plurality of touch electrodes, and
the driving chip area is provided with:
a plurality of test pins used for transmitting a test signal, and electrically connected to second ends of the plurality of touch leads to transmit the test signal to the plurality of touch electrodes.

In an embodiment, the plurality of touch leads are arranged in a first direction, a plurality of the test pins are arranged in the first direction, the first direction is parallel to a side of the display area close to the driving chip area.

In an embodiment, the driving chip area is further provided with:
a multiplexing circuit comprising a plurality of multiplexing input terminals and a plurality of multiplexing output terminals, and
wherein the number of the multiplexing input terminals is less than the number of the multiplexing output terminals, the plurality of multiplexing input terminals and the plurality of test pins are in one-to-one correspondence, the plurality of multiplexing output terminals and the plurality of touch leads are in one-to-one correspondence, each of the plurality of multiplexing input terminals is electrically connected to a corresponding test pin, and each of the plurality of multiplexing output terminals is electrically connected to a corresponding touch lead.

In an embodiment, the multiplexing circuit is positioned between the plurality of test pins and the plurality of touch leads, the plurality of multiplexing input terminals are arranged in the first direction, and the plurality of multiplexing output terminals are arranged in the first direction.

In an embodiment, the terminal area comprises a wiring area disposed around the driving chip area, the wiring area is provided with:
a plurality of first control pins for transmitting a first control signal, and
wherein the multiplexing circuit further comprises a plurality of control terminals electrically connected to the plurality of first control pins to transmit the first control signal to the plurality of control terminals to control a turned on state (or a conductive state) between the plurality of multiplexing input terminals and the plurality of multiplexing output terminals.

In an embodiment, the wiring area is further provided with:
a plurality of second control pins for transmitting a second control signal, and
wherein the plurality of second control pins are in one-to-one correspondence with the plurality of first control pins, and each of the plurality of second control pins is electrically connected to a corresponding first control pin to transmit the second control signal to the plurality of control terminals to electrically disconnect the plurality of multiplexing input terminals and the plurality of multiplexing output terminals.

In an embodiment, the driving chip area is further provided with:
a plurality of dummy pins located on a side of the plurality of test pins and a side of the multiplexing circuit which are close to the plurality of first control pins, and arranged in a second direction perpendicular to the first direction, and
wherein a connection line connected to one of the control terminals, and a corresponding first control pin is provided between two adjacent dummy pins.

In an embodiment, a plurality of the first control pins are arranged in the first direction, a symmetry axis of the plurality of first control pins in the first direction coincides with a symmetry axis of the plurality of test pins in the first direction.

In an embodiment, the driving chip area is further provided with:
a plurality of touch pin groups, wherein each of the plurality of touch pin groups comprises a plurality of touch pins for transmitting a touch signal,
wherein the plurality of touch pins and the plurality of touch leads are in one-to-one correspondence, and the plurality of touch pins are electrically connected to the second ends of the plurality of touch leads to transmit the touch signal to the plurality of touch electrodes.

In an embodiment, the driving chip area is further provided with:
a plurality of data pin groups, wherein each of the data pin groups comprises a plurality of data pins for transmitting a data signal, and
wherein the plurality of data pin groups and the plurality of touch pin groups are alternately arranged in the first direction, and the plurality of data pin groups and the plurality of touch pin groups are bonded to a same driving chip to perform a transmission of the touch signal and the data signal.

Advantageous Effects

The present invention provides a display panel including a display area and a terminal area on a side of the display area, the terminal area includes a driving chip area bonded with a driving chip, the drive chip area is provided with a plurality of touch leads and a plurality of test pins, first ends of the plurality of touch leads are electrically connected to a plurality of touch electrodes in the display area respectively, the plurality of test pins are configured to transmit the test signal; wherein the plurality of test pins are electrically connected to second ends of the plurality of touch leads respectively to transmit the test signal to the plurality of touch electrodes. In the present invention, the plurality of test pins for transmitting the test signal are also arranged in the driving chip area, so that the test pins having a larger number are prevented from extending to be arranged in the wiring area, thereby reducing a risk that a touch test cannot be performed because the test pins cannot be arranged in the wiring area of the terminal area due to a large number of the test pins, improving product yield, and reducing product cost.

DESCRIPTION OF DRAWINGS

The technical solutions and other beneficial effects of the present application will be apparent from the detailed description of the specific embodiments of the present application with reference to the accompanying drawings

DETAILED DESCRIPTION OF EMBODIMENTS

Figure 1:
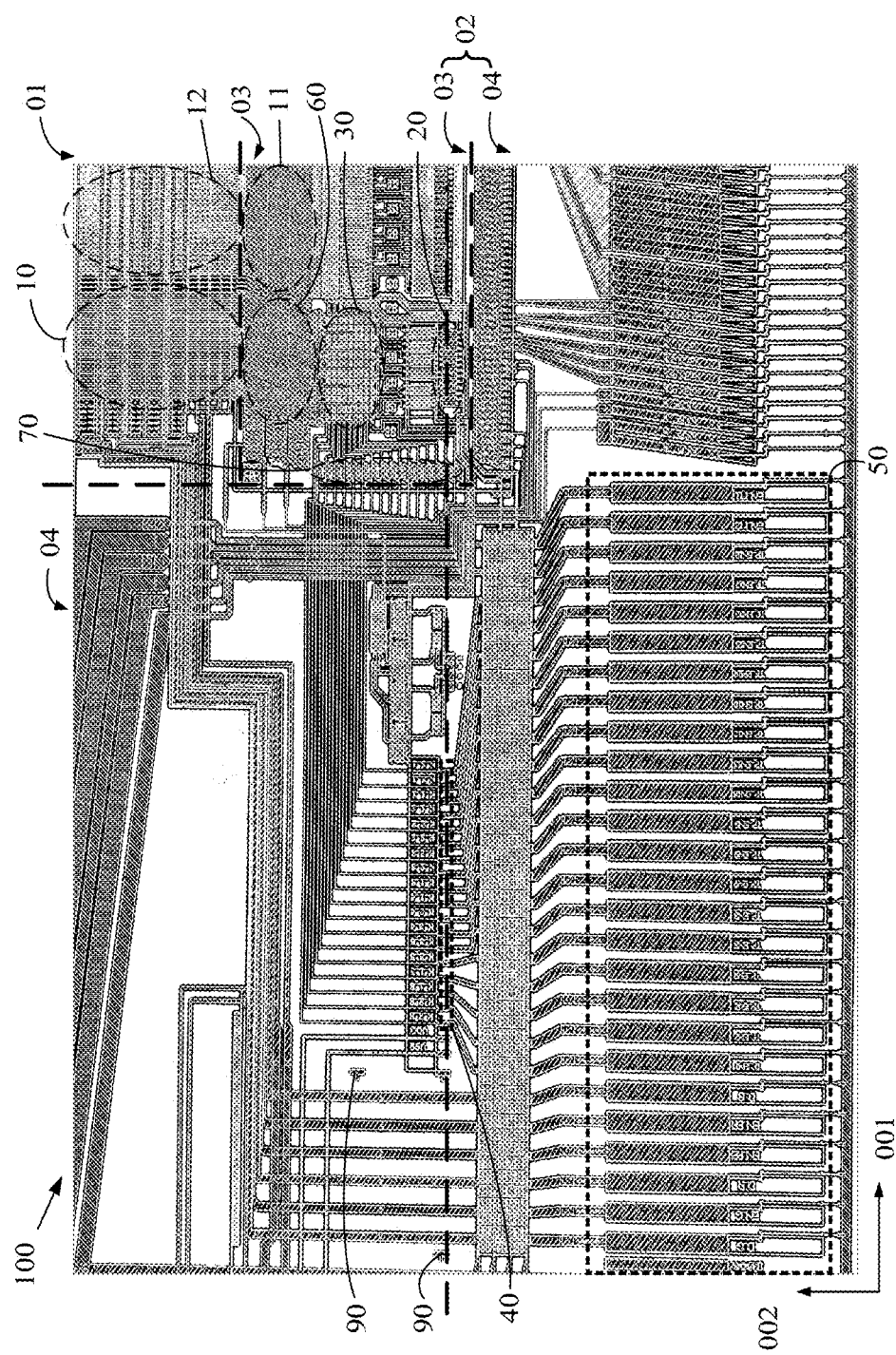
FIG. 1 is a schematic top view of a first embodiment of a display panel according to an embodiment of the present invention.

Technical solutions in embodiments of the present application will be clearly and completely described below in conjunction with drawings in the embodiments of the present application. Obviously, the described embodiments are only a part of embodiments of the present application, rather than all the embodiments. Based on the embodiments in the present application, all other embodiments obtained by those skilled in the art without creative work fall within the protection scope of the present application. In the description of the present invention, it should be understood that the orientation or positional relationship indicated by the terms "upper", "lower", "near", etc. are based on the orientation or positional relationship shown in the drawings, for example, the term "upper" only means that a surface is above the object, specifically refers to "directly above", "obliquely above", and "upper surface", as long as it is above the level of the object. The above orientation or positional relationship is only for the convenience of describing the present invention and simplifying the description, rather than indicating or implying that the devices or elements must have a specific orientation, and be constructed and operated in a specific orientation, and thus, it cannot be understood as a limitation of the present invention.

In addition, it should be noted that the drawings provide only structures and steps which are closely related to the present invention, and some details which are not related to the present invention are omitted. The purpose is to simplify the drawings to make the invention clear at a glance, rather than indicating that the apparatus and method in practice are the same as those in the drawings, and those in the drawings are not a limitation of the apparatus and method in practice.

Reference to "embodiments" herein means that a specific feature, structure, or characteristic described in conjunction with the embodiments may be included in at least one embodiment of the present invention. The phrases appearing in various places in the specification do not necessarily all refer to the same embodiment, nor are they independent or alternative embodiments mutually exclusive with other embodiments. Those skilled in the art clearly and implicitly understand that the embodiments described herein can be combined with other embodiments. In addition, it should be noted that the drawings provide only structures which are closely related to the present invention, and some details which are not related to the present invention are omitted. The purpose is to simplify the drawings to make the invention clear at a glance, rather than indicating that the apparatus in practice is the same as that in the drawing, and those in the drawings are not a limitation of the apparatus in practice.

The present invention provides a display panel including, but not limited to, the following embodiments and combinations of the following embodiments.

In an embodiment, as shown in FIG. 1, a display panel 100 includes a display area 01 and a terminal area 02 located at least on one side of the display area 01, the terminal area 02 includes a driving chip area 03 bonded with a driving chip, the display area 01 is provided with a plurality of touch leads 10 and a plurality of touch electrodes, and first ends of the plurality of touch leads 10 are electrically connected to the plurality of touch electrodes; the driving chip area 03 is provided with a plurality of test pins 20 for transmitting test signal(s); wherein the plurality of test pins 20 are electrically connected to second ends of the plurality of touch leads 10 to transmit the test signal(s) to the plurality of touch electrodes.

The display area 01 may be rectangular, the terminal area 02 may be arranged around a left side, a lower side, and a right side of the display area 01, and FIG. 1 shows a top view from a lower left corner of the display area 01 to a portion of a corresponding terminal area 02. Further, the driving chip area 03 may be located at least on the lower side of the display area 01, a plurality of panel pins may be provided on the driving chip area 03, a plurality of chip pins may be provided on the driving chip, and the driving chip may be bonded to the driving chip area 03 in the terminal area 02 to electrically connect a portion of panel pins and a portion of the chip pins.

Specifically, the plurality of touch electrodes may be arranged in rows, columns, or matrices in the display area 01, and the plurality of touch electrodes may implement a touch function in a self-capacitance or mutual-capacitance manner. In particular, when the plurality of touch electrodes implement the touch function in the self-capacitance manner, a number of the touch electrodes is relatively large, and the touch electrodes cannot be extended to a region in the terminal area 02 except the driving chip area 03 to load corresponding touch test signal(s), so that the touch test cannot be performed.

Figure 2:
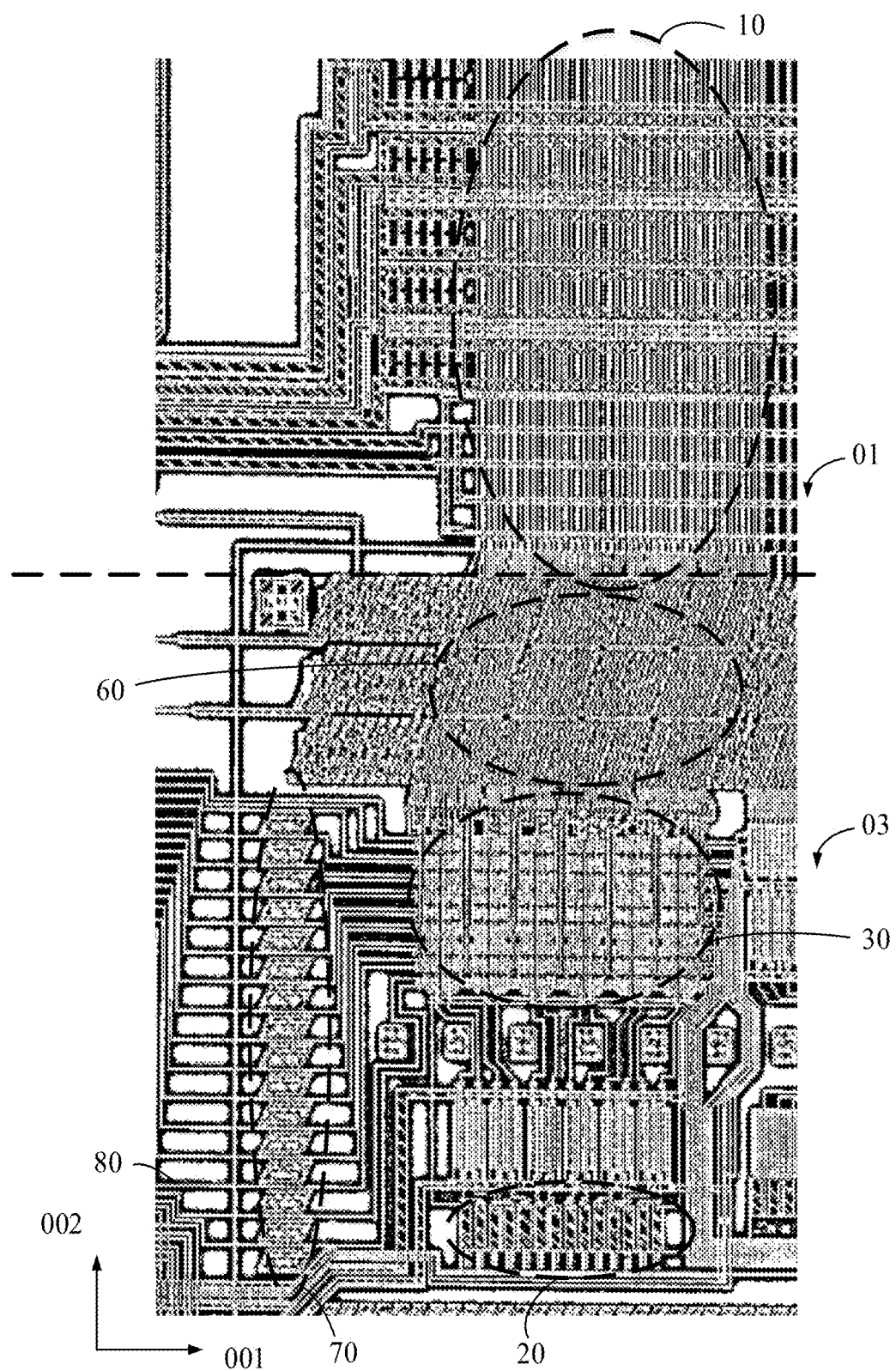
FIG. 2 is a schematic top view of a second embodiment of a display panel according to an embodiment of the present invention.

In an embodiment, as shown in FIG. 2, the plurality of touch leads are arranged in a first direction 001, the plurality of test pins 20 are arranged in the first direction 001, and the first direction 001 is parallel to a side of the display area 01 close to the driving chip area 03. It may be appreciated that the arrangement directions of the plurality of touch leads 10 and the plurality of test pins 20 are same and are all in the first direction 001, which may facilitate alignment between the plurality of touch leads 10 and the plurality of test pins 20; wherein a number of the plurality of touch leads 10 may or may not be equal to a number of the plurality of test pins 20, further, an axis of symmetry of the plurality of touch leads 10 in a second direction 002 and an axis of symmetry of the plurality of test pins 20 in the second direction 002 may coincide with each other, so as to shorten a distance between the plurality of touch leads 10 and the plurality of test pins 20, and the second direction 002 may be perpendicular to the first direction 001.

In an embodiment, as shown in FIG. 1, the driving chip area 03 is further provided with a multiplexing circuit 30 including a plurality of multiplexing input terminals and a plurality of multiplexing output terminals; wherein a number of the multiplexing input terminals is smaller than a number of the multiplexing output terminals, the plurality of multiplexing input terminals and the plurality of test pins 20 are in one-to-one correspondence, the plurality of multiplexing output terminals and the plurality of touch leads 10 are in one-to-one correspondence, each of the multiplexing input terminals is electrically connected to the corresponding test pins and each of the multiplexing output terminals is electrically connected to the corresponding touch leads 10.

It may be appreciated that since the number of the multiplexing input terminals is smaller than the number of the multiplexing output terminals, i.e., the number of the test pins 20 is smaller than the number of the touch pins 10, that is, the plurality of touch pins 10 having a larger number may be electrically connected to the plurality of test pins 20 having a smaller number through the multiplexing circuit to achieve transmission of the test signal(s) to the plurality of touch electrodes, which greatly saves spaces for setting the plurality of test pins 20.

In an embodiment, as shown in FIG. 2, the multiplexing circuit 30 is located between the plurality of test pins 20 and the plurality of touch leads 10, the plurality of multiplexing input terminals are arranged in the first direction 001, and the plurality of multiplexing output terminals are arranged in the first direction 001. It may be appreciated that the arrangement directions of the plurality of multiplexed input terminals and the plurality of test pins 20 are same and are all in the first direction 001, which may facilitate alignment and connection between the plurality of multiplexing input terminals and the plurality of test pins 20; likewise, the present embodiment also facilitates alignment and connection between the plurality of multiplexing output terminals and the plurality of touch leads 10. Furthermore, on a basis that the multiplexing circuit 30 is positioned between the plurality of test pins 20 and the plurality of touch leads 10, the plurality of multiplexing input terminals are positioned near the plurality of test pins 20, and the plurality of multiplexing output terminals are positioned near the plurality of touch leads 10, so that a connection distance between the multiplexing circuit 30 and the plurality of test pins 20 and a connection distance between the multiplexing circuit 30 and the plurality of touch leads 10 can be shortened, and reliability of electrical connection can be improved.

Figure 3:
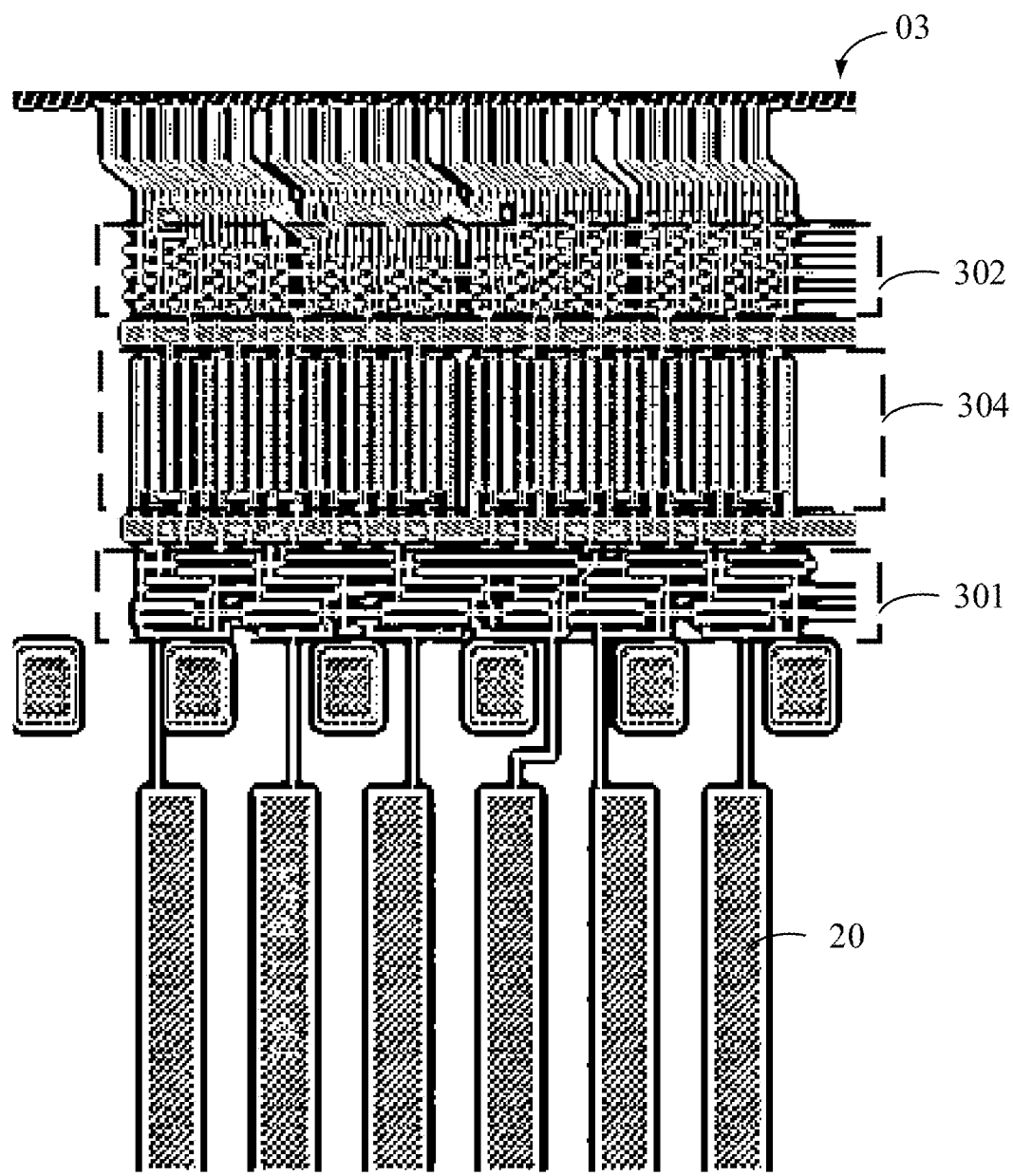
FIG. 3 is a schematic top view of a third embodiment of a display panel according to an embodiment of the present invention.

As shown in FIG. 3, the multiplexing circuit 30 may include a first multiplexing circuit 301 and a second multiplexing circuit 302, the first multiplexing circuit 301 is connected between the plurality of multiplexing input terminals and the second multiplexing circuit 302, the second multiplexing circuit 302 is connected between the first multiplexing circuit 301 and the plurality of multiplexing output terminals, and the first multiplexing circuit 301 and the second multiplexing circuit 302 may be same or different. Specifically, as shown in FIG. 3, a case where the number of the test pins 20 is 6, the first multiplexing circuit 301 is a 1 to 3 multiplexing circuit, and the second multiplexing circuit 302 is a 1 to 4 multiplexing circuit, is taken as an example for description.

Figure 4:
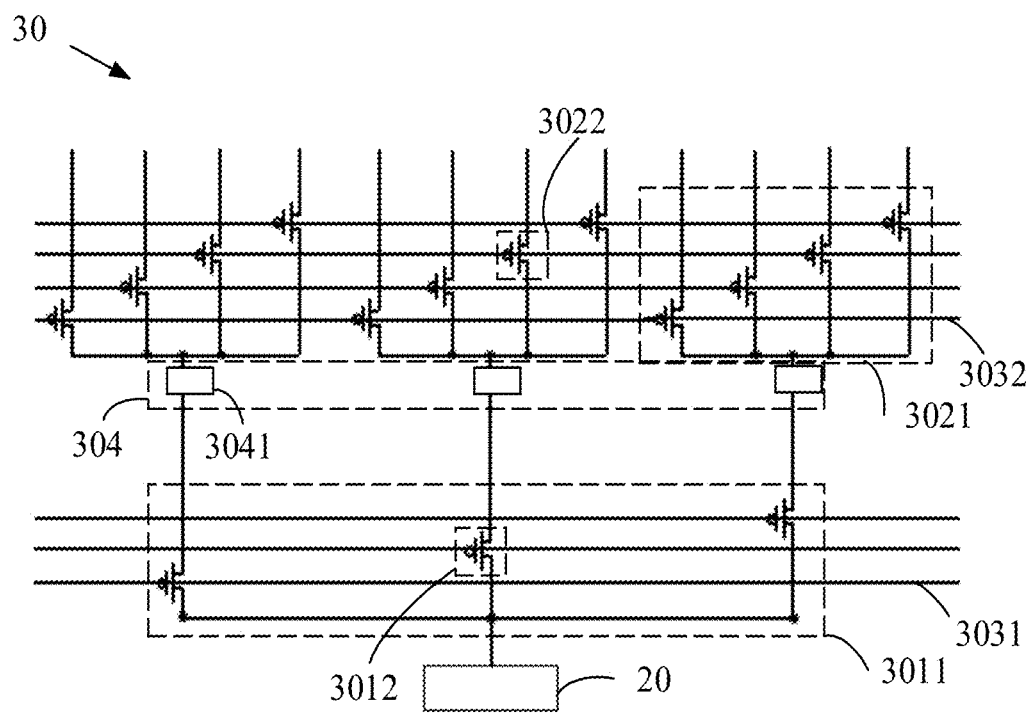
FIG. 4 is an equivalent circuit diagram of a multiplexing circuit according to an embodiment of the present invention.
Figure 5:
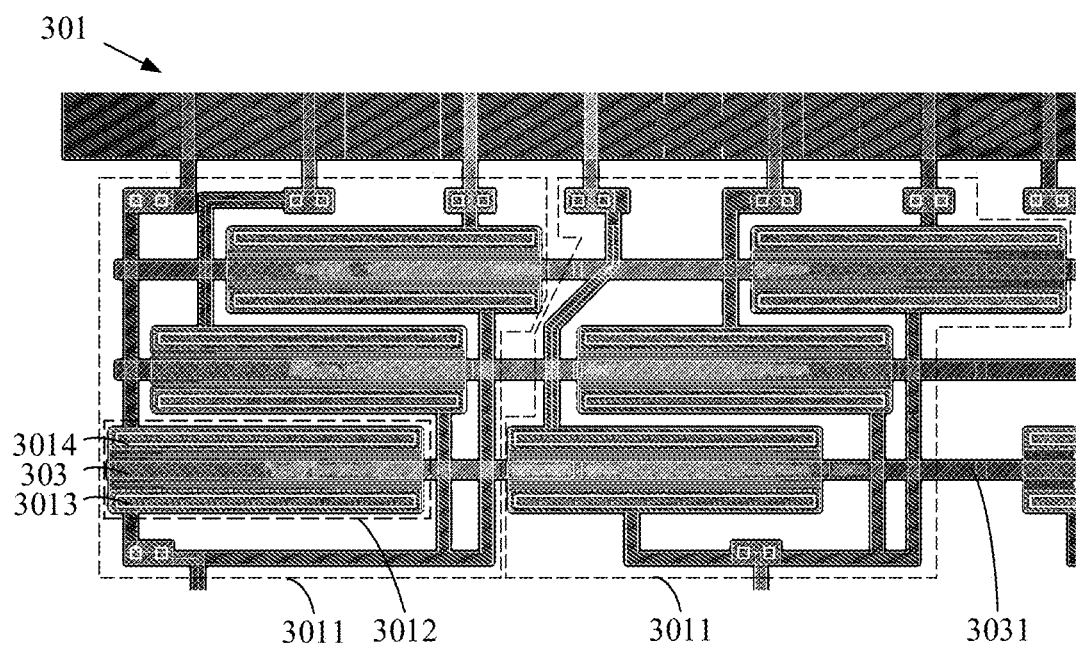
FIG. 5 is a schematic top view of a fourth embodiment of a display panel according to an embodiment of the present invention.
Figure 6:
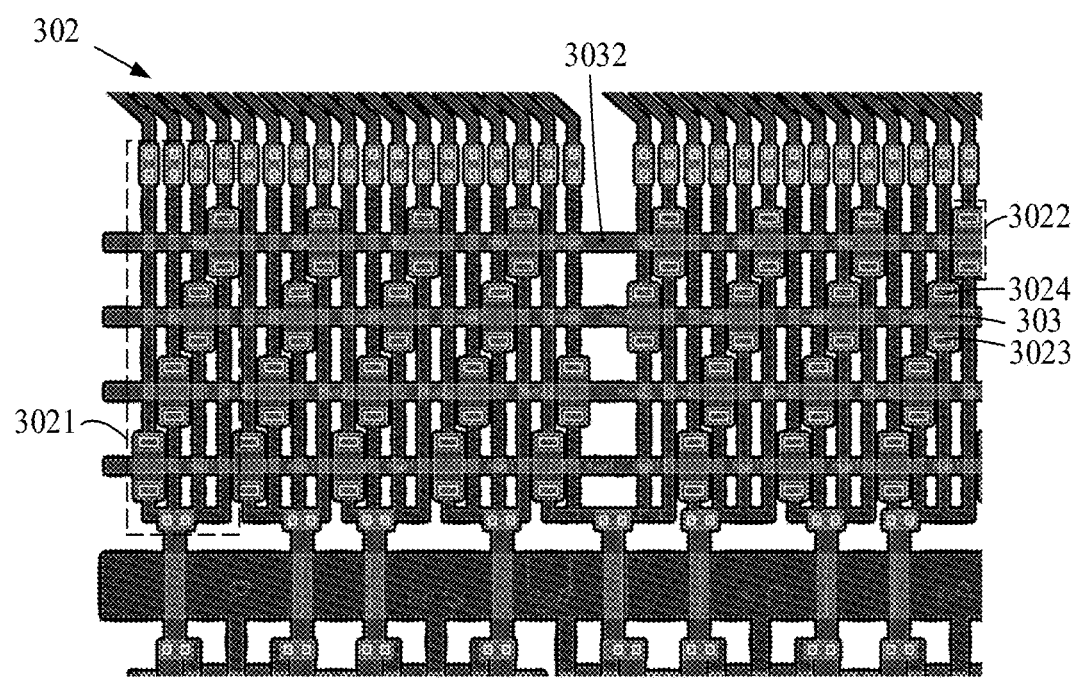
FIG. 6 is a schematic top view of a fifth embodiment of a display panel according to an embodiment of the present invention.

As shown in FIG. 4, the first multiplexing circuit 301 may include a plurality of first units 3011, each of the first units 3011 may have one first input terminal and three first output terminals, and the second multiplexing circuit 302 may include a plurality of second units 3021, each of the second units 3021 may have one second input terminal and four second output terminals. Specifically, the first input terminal of each first unit 3011 may be electrically connected to a corresponding test pin 20, one of the first output terminals of each first unit 3011 may be electrically connected to the second input terminal of one second unit 3021, and the second output terminal of each second unit 3021 may be electrically connected to a corresponding touch lead 10. Further, in each of the first units 3011, a first transistor 3012 is provided between each of the first input terminals and each of the first output terminals, and a source 3013 and a drain 3014 of the first transistor 3012 are connected to the corresponding first input terminal and the first output terminal, respectively, as shown in FIG. 5. In each of the second units 3021, a second transistor 3022 is provided between each of the second input terminals and each of the second output terminals. As shown in FIG. 6, a source 3023 and a drain 3024 of the second transistor 3022 are respectively connected to a corresponding second input terminal and a second output terminal.

It is noted that turned-on periods of a plurality of the first transistors 3012 in each of the first units 3011 do not overlap, that is, only one of the first transistors 3012 in each of the first units 3011 is turned on at each time to electrically connect the first input terminal to one of the first output terminals; similarly, turned-on periods of a plurality of the second transistors 3022 in each of the second units 3021 do not overlap, that is, only one of the second transistors 3022 in each of the second units 3021 is turned on at each time to electrically connect the second input terminal to one of the second output terminals. Thus, for each of the test pins 20, although the test pin 20 is connected to twelve of the touch leads 10 by being connected to one of the first units 3011 and three of the second units 3021, at each instant, one of the first transistors 3012 of the first unit 3011 is turned on such that the test pin 20 is electrically connected to the first input terminal of the corresponding second unit 3021, and one of the second transistors 3022 of the corresponding second unit 3021 is turned on such that the test pin 20 is electrically connected to the corresponding touch lead 10 by the second transistor 3022.

Further, as shown in FIGS. 3 and 4, an antistatic circuit 304 may be provided between the first multiplexing circuit 301 and the second multiplexing circuit 302, and both ends of the antistatic circuit 304 are electrically connected to the first multiplexing circuit 301 and the second multiplexing circuit 302, respectively. Specifically, as shown in FIG. 4, the antistatic circuit 304 may include a plurality of antistatic units 3041, each of the plurality of antistatic units 3041 includes an antistatic input terminal and an antistatic output terminal, the antistatic input terminal is electrically connected to the drain 3014 of corresponding one of the first transistors 3012, and the antistatic output terminal is electrically connected to sources 3023 of corresponding four of the second transistors 3022.

In an embodiment, as shown in FIG. 1, the terminal area 02 includes a wiring area 04 disposed around the driving chip area 03, the wiring area 04 is provided with a plurality of first control pins 40, the plurality of first control pins 40 is for transmitting a first control signal(s); in combination with FIGS. 5 and 6, the multiplexing circuit 30 further includes a plurality of control terminals 303, the plurality of control terminals is electrically connected to the plurality of first control pins 40, such that the first control signal(s) is transmitted to the plurality of control terminals 303 to control a conductive state between the plurality of multiplexing input terminals and the plurality of multiplexing output terminals.

As shown in FIGS. 4 to 6, the plurality of control terminals 303 may include a plurality of gates of the plurality of first transistors 3012 and a plurality of gates of the plurality of second transistors 3022, three gates of three first transistors 3012 in each of the first units 3011 may be electrically connected to different first control pins 3012 to ensure that the three first transistors 3012 are turned on at different times, and four gates of four second transistors 3022 in each of the second units 3021 may be electrically connected to different first control pins 40 to ensure that the four second transistors 3022 are turned on at different times. It should be noted that the plurality of first control pins 40 may be provided in the wiring area 04 and connected to the plurality of control terminals 303 in the multiplexing circuit 30 through wires because of a limited space of the driving chip area 03. It can be understood that the plurality of first control pins 40 are disposed in the wiring area 04 to avoid occupying a space of the driving chip area 03, reduce a risk of interference or even a short circuit due to line contact in the driving chip area 03, and improve reliability of line transmission signals.

Further, as shown in FIGS. 4 and 5, since the first input terminals of different first units 3011 are electrically connected to different test pins 3011, that is, test signals received by the sources 3013 of the different first units 3011 are different or not received at the same time, and the different control terminals 303 located in the different first units 3011 may be electrically connected to a same first control pin 40 through a same first lead 3031; similarly, as shown in FIGS. 4 and 6, since the second input terminals of the different second units 3021 are electrically connected to different first output terminals of the first units 3011, that is, the second transistors 3022 in the different second units 3021 are not turned on at the same time, or the received test signals are different, different control terminals 303 located in different second units 3021 may be electrically connected to a same first control pin through a same second lead 3032.

Specifically, a case where the number of the test pins 20 is 6 is taken as an example for description. As shown in FIGS. 4 and 5, the three first transistors 3012 in each of the first units 3011 may be respectively located in three rows, the sources 3013 of the three first transistors 3012 are electrically connected to be a corresponding first input terminal, the first input terminal is electrically connected to the corresponding test pin 20, and further, as shown in FIG. 3, six test pins 20 are respectively connected to the first input terminals of corresponding six first units 3011 in the first multiplexing circuit 301; meanwhile, as shown in FIG. 5, in the first multiplexing circuit 301, the plurality of control terminals 303 corresponding to the plurality of first transistors 3012 located in a same row may be electrically connected to a same first control pin 40 through the same first lead 3031. As shown in FIGS. 4 and 6, four second transistors 3022 in each of the second units 3021 may be respectively located in four rows, the sources 3023 of the four second transistors 3022 are electrically connected to be a corresponding second input terminal, the second input terminal is electrically connected to the corresponding first output terminal, and further, as shown in FIG. 3, eighteen first output terminals are respectively connected to the second input terminals of corresponding eighteen second units 3021 in the second multiplexing circuit 302; meanwhile, as shown in FIG. 6, in the second multiplexing circuit 302, the plurality of control terminals 303 corresponding to the plurality of second transistors 3022 located in a same row may be electrically connected to a same first control pin 40 through a same second lead 3032.

Figure 7:
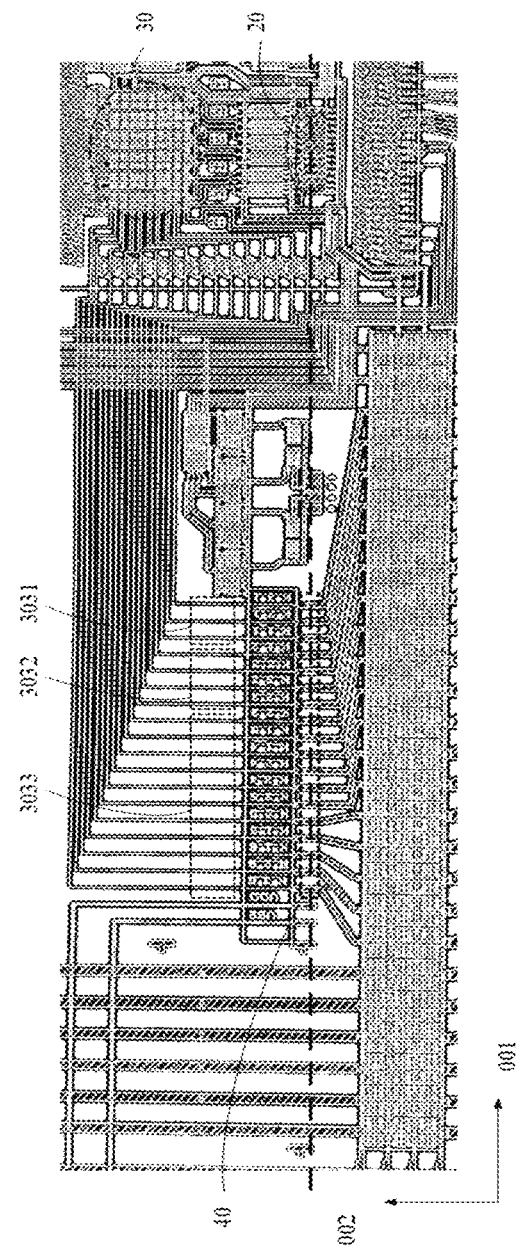
FIG. 7 is a schematic top view of a sixth embodiment of a display panel according to an embodiment of the present invention.

In an embodiment, as shown in FIGS. 1 and 7, a plurality of the first control pins 40 are arranged in the first direction 001, an axis of symmetry of the plurality of first control pins 40 in the first direction 001 and the axis of symmetry of the plurality of test pins 20 in the first direction 001 coincide with each other. It can be seen with reference to FIGS. 4 and 6, a number of the first leads 3031 is equal to a number of the first transistors 3012 in a same first unit 3011, that is, the number of the first leads 3031 is 3, and a number of the second leads 3032 is equal to a number of the second transistors 3022 in a same second unit 3021, that is, the number of the second leads 3032 is 4; further, as shown in FIG. 7, a portion of the first control pin may be electrically connected to the plurality of first transistors 3012 and the plurality of second transistors 3022 through a plurality of third leads 3033. It may be understood that when at least one of the plurality of first transistors 3012 and the plurality of second transistors 3022 is electrically connected to the corresponding test pin 20, in order to reduce the influence of others of the plurality of first transistors 3012 and the plurality of second transistors 3022 not electrically connected to the corresponding test pin 20 on the touch test, an electrical signal of a specific voltage may be input to the plurality of first transistors 3012 and the plurality of second transistors 3022, which are not electrically connected to the corresponding test pin 20, through the plurality of third leads 3033.

Specifically, during the touch test phase, the first control signal(s) may be input to the plurality of first control pins 40 to control conduction between at least one of the multiplexing input terminals and at least one of the multiplexing output terminals to form at least one current path, and the test signal(s) may be input to the plurality of test pins 20 to input the test signal(s) to a corresponding at least one of the touch electrodes through the at least one current path, so as to implement the touch test. It should be understood that, since the space of the wiring area 04 is large enough to facilitate arrangement of the plurality of first control pins 40, the plurality of first control pins 40 may be arranged in the wiring area 04, so that the plurality of first control pins 40 in this embodiment may be arranged in the first direction 001. With reference to the above discussion, a plurality of probes may be respectively pinned to the corresponding first control pins 40 and the corresponding test pins 20 through a probing manner. Therefore, the symmetry axis of the plurality of first control pins 40 in the first direction 001 and the symmetry axis of the plurality of test pins 20 in the first direction 001 may be arranged to coincide with each other, so that the plurality of probes may be aligned with the plurality of first control pins 40 and the plurality of test pins 20 at the same time, and the manufacturer may set the plurality of probes in a same direction.

In an embodiment, the wiring area 04 is further provided with a plurality of positioning marks 90, the plurality of positioning marks 90 may be located on a side of the plurality of first control pins 40 away from the plurality of test pins the plurality of positioning marks 90 are used for positioning the plurality of first control pins 40 and the plurality of probes. Specifically, the symmetry axis in the first direction 001 of the plurality of positioning marks 90 arranged in the first direction 001 may coincide with the symmetry axis of the plurality of first control pins 40 in the first direction 001, and the plurality of positioning marks 90 may also be arranged in the second direction 002.

Figure 8:
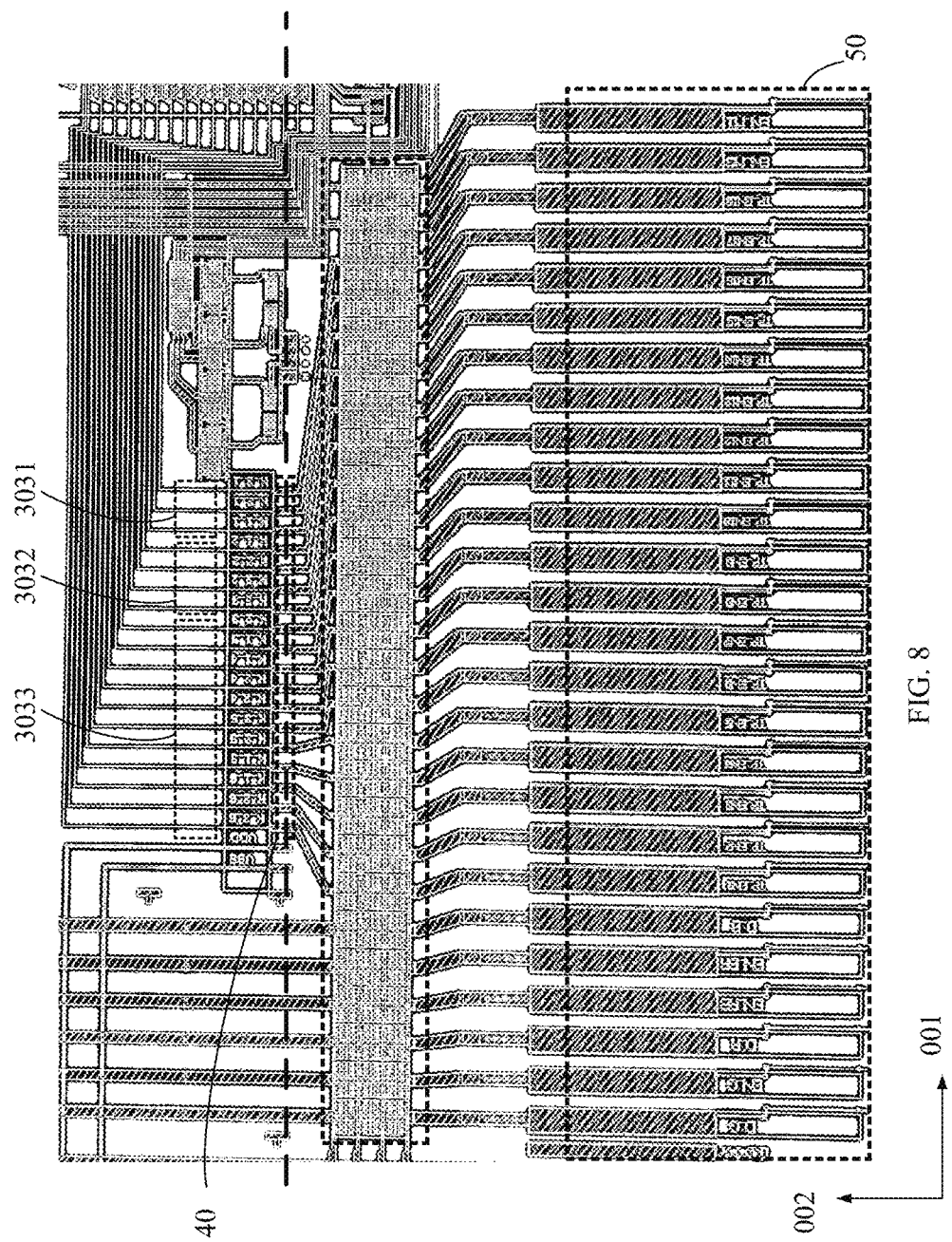
FIG. 8 is a schematic top view of a seventh embodiment of a display panel according to an embodiment of the present invention.

In an embodiment, as shown in FIGS. 1 and 8, the wiring area 04 is further provided with a plurality of second control pins 50, the plurality of second control pins 50 is for transmitting a second control signal(s); wherein the plurality of second control pins 50 and the plurality of first control pins 40 are in one-to-one correspondence, and each of the second control pins 50 is electrically connected to the corresponding first control pin 40, as shown in FIGS. 5 and 6, so that the second control signal is transmitted to the plurality of control terminals 303 to electrically disconnect the plurality of multiplexing input terminals and the plurality of multiplexing output terminals.

It may be understood that when the plurality of first transistors 3012 and the plurality of second transistors 3022 are both P-type transistors, i.e., are turned on at a low potential, the second control signal loaded on each of the second control pins 50 may be a high potential voltage, a voltage value of the high potential voltage is greater than a voltage value of the low potential voltage, so that the plurality of first transistors 3012 and the plurality of second transistors 3022 are both turned off.

Specifically, when the touch test phase is completed, the second control signal(s) may be input to the plurality of second control pins 50 to control the electrical disconnection between at least any one of the multiplexing input terminals and any one of the multiplexing output terminals to avoid forming any current path and to avoid display abnormality due to leakage of the multiplexing circuit 30. Wherein a flexible circuit board having a plurality of terminals may be bonded to the plurality of second control pins 50 in a bonding manner, and the second control signal(s) is transmitted to the plurality of second control pins 50 through the plurality of terminals on the flexible circuit board by applying the second control signal(s) to the flexible circuit board.

As shown in FIG. 1, in the second direction 002, the plurality of second control pins 50 may be located on a side of the plurality of first control pins 40 away from the display area 01, and the plurality of second control pins 50 may be arranged in the first direction 001. It may be understood that providing a plurality of the second control pins 50 close to an edge region of the display panel not only facilitates a bonding process of the plurality of second control pins 50, but also facilitates providing a plurality of the second control pins 50 having a larger size due to a larger size of the edge region of the display panel in the first direction 001. Further, a symmetry axis of the plurality of second control pins 50 in the second direction 002 and the symmetry axis of the plurality of first control pins 40 in the second direction 002 may coincide with each other, so that a distance between the plurality of second control pins 50 and the plurality of first control pins 40 may be further shortened, and the reliability of the electrical connection may be improved. Further, an antistatic circuit may be provided between the plurality of first control pins and the plurality of second control pins 50 to improve reliability of the circuit.

In an embodiment, as shown in FIGS. 1 and 2, a plurality of touch pin groups 60 are provided in the driving chip area 03, each of the touch pin groups includes a plurality of touch pins, the plurality of touch pins is for transmitting a touch signal(s); wherein the plurality of touch pins in the plurality of touch pin groups correspond to the plurality of touch leads 10 in one-to-one correspondence, and the plurality of touch pins are electrically connected to second ends of the plurality of touch leads 10 to transmit the plurality of touch signals to the plurality of touch electrodes.

Specifically, as shown in FIGS. 1 and 2, the touch pin groups 60 near an edge of the driving chip area 03 may be located between the plurality of touch leads 10 and the multiplexing circuit 30. It should be noted that, in the touch test phase, the touch pin group 60 is not subjected to a probing process or a bonding process, and both ends of the touch pin group 60 are respectively connected to the plurality of multiplexing output terminals of the multiplexing circuit 30 and the plurality of touch leads 10, that is, the test signal(s) is transmitted to the plurality of touch electrodes through the plurality of test pins 20, the multiplexing circuit 30, the touch pin groups 60, and the plurality of touch leads 10 in sequence. Of course, when the touch test phase is completed, it can be understood from the above discussion that any one of the multiplexing input terminals and any one of the multiplexing output terminals are electrically disconnected, and at this time, the corresponding touch signal can be input to the touch pin to be transmitted to the plurality of touch electrodes through the touch leads 10 to implement touch recognition.

In an embodiment, as shown in FIG. 1, the driving chip area 03 is further provided with a plurality of data pin groups 11, each of the plurality of data pin groups 11 includes a plurality of data pins, the plurality of data pins is for transmitting a data signal(s); wherein the plurality of data pin groups 11 and the plurality of touch pin groups 60 are alternately arranged in the first direction 001, and the plurality of data pin groups 11 and the plurality of touch pin groups 60 are bonded to a same driving chip to transmit the touch signal(s) and the data signal(s).

Specifically, as shown in FIG. 1, a plurality of data leads 12 and a plurality of display units are further provided in the display area 01. A first end of each of the data leads 12 is electrically connected to a corresponding plurality of the display units, and a second end of each of the data leads 12 is electrically connected to a corresponding data pin to transmit the data signal(s) to the plurality of display units. It may be understood that a plurality of data terminal groups and a plurality of touch terminal groups arranged alternately in one direction may be provided on the driving chip. Further, a number of the data terminal groups may be equal to a number of the data pin groups 11, and the number of the touch terminal groups may be equal to a number of the touch pin groups 60, so that when the plurality of data pin groups 11 and the plurality of touch pin groups 60 are bonded to the driving chip, each of the data pin groups 11 may be electrically connected to the corresponding data terminal groups, and each of the touch pin groups 60 may be electrically connected to the corresponding touch terminal groups. A TDDI (Touch Display Diver Integrated, the touch driving chip and the display driving chip are combined into one) product, formed by the plurality of data pin groups 11 and the plurality of touch pin groups 60 alternately arranged, and the plurality of data terminal groups and the plurality of the touch terminal groups alternately arranged, as described above, is also applicable to various embodiments of the present application and combinations of the embodiments.

In an embodiment, as shown in FIGS. 1 and 2, the driving chip area 03 is further provided with a plurality of dummy pins 70, the plurality of dummy pins 70 are located on sides of the plurality of test pins 20 and the multiplexing circuit 30 near the plurality of first control pins 40, the plurality of dummy pins 70 are arranged in the second direction 002; as shown in FIGS. 1 to 3, 5, and 6, a connecting line 80 connected to one control terminal 303 and a corresponding first control pin 40 is provided between two adjacent dummy pins 70. It may be appreciated that a plurality of the dummy pins 70 may be used to separate the plurality of connection lines 80 to prevent signal interference due to an overly close distance among the plurality of connection lines 80.

It should be noted that a plurality of terminals may be provided on the driving chip, and the plurality of terminals may correspond to at least the plurality of touch pins and the plurality of dummy pins 70 one to one. After the touch test is completed, the plurality of terminals may be bonded to at least the plurality of touch pins and the plurality of dummy pins 70, and the driving chip may cover the driving chip area 03. It should be noted that an area corresponding to the plurality of test pins 20 and the multiplexing circuit 30 on the driving chip may be left blank, that is, no terminals are provided.

The present invention also provides a test tool, the test tool is for touch detection of any one of display panels as described above, and the test tool includes, but not limited to, the following embodiments and combinations of the following embodiments.

In an embodiment, the test tool includes a plurality of first probes, the plurality of first probes is for transmitting the test signal(s); wherein the plurality of first probes correspond to the plurality of test pins one-to-one, and the plurality of first probes are pinned to the plurality of test pins to transmit the test signal(s) to the plurality of test pins. Specifically, since the plurality of test pins are too small in size and distance, it is not convenient to directly load a signal(s) onto the test pins through lines, so the test signal(s) generated by a signal source can be loaded onto at least one of the first probes so as to be transmitted to at least one of the test pins on the display panel.

In an embodiment, the display panel includes a plurality of first control pins as described above, and the test tool further includes a plurality of second probes, the plurality of second probes is for transmitting a first control signal(s); wherein the plurality of second probes are in one-to-one correspondence with the plurality of first control pins, and the plurality of second probes are used to pin to the plurality of first control pins to transmit the first control signal(s) to the plurality of first control pins; wherein a symmetry axis of the plurality of first probes and a symmetry axis of the plurality of second probes coincide with each other in a direction in which the plurality of first probes and the plurality of second probes are arranged.

According to the above analysis, the symmetry axis of the plurality of first control pins 40 in the first direction 001 and the symmetry axis of the plurality of test pins 20 in the first direction 001 are arranged to coincide with each other, so that while the plurality of first probes can be aligned with the plurality of first control pins 40, the plurality of second probes can be aligned with the plurality of test pins 20, which is conducive for the manufacturer to arranging the plurality of first probes and the plurality of second probes in a same direction, thereby saving cost and reducing alignment difficulty.

The present invention provides a display panel and a test tool, the display panel includes a display area and a terminal area on one side of the display area, the terminal area includes a driving chip area bonded with a driving chip, the driving chip area is provided with: a plurality of touch leads, first ends of the touch leads are electrically connected to a plurality of touch electrodes in the display area; a plurality of test pins for transmitting a test signal(s); wherein the plurality of test pins are electrically connected to second ends of the plurality of touch leads to transmit the test signal(s) to the plurality of touch electrodes. In the present invention, a plurality of the test pins for transmitting a test signal(s) are also provided in the driving chip area, so that the plurality of test pins having a larger number are prevented from extending to be arranged in the wiring area, thereby reducing a risk that a touch test cannot be performed since the larger number of the test pins cannot be arranged in a wiring region of the terminal region, improving a yield of a product, and reducing cost of the product.

The display panel and the test tool provided in the embodiment of the present invention are described in detail above. Specific examples are used in the present specification to describe the principle and the embodiment of the present invention in detail. The description of the above embodiment is merely intended to help understand the technical solution and the core idea of the present invention. Those of ordinary skill in the art will appreciate that they may still modify the technical solutions described in the foregoing embodiments, or equivalently replace some of the technical features therein; these modifications or substitutions do not separate the nature of the respective technical solutions from the scope of the technical solutions of the embodiments of the present invention.

What is claimed is:

1. A display panel, wherein the display panel comprises a display area and a terminal area arranged at least on a side of the display area, the terminal area comprises a driving chip area bonded with a driving chip, and a wiring area around the driving chip area, the display area is provided with:
a plurality of touch leads and a plurality of touch electrodes, wherein first ends of the plurality of touch leads are electrically connected to the plurality of touch electrodes, the plurality of touch leads are arranged in a first direction, and the first direction is parallel to a side of the display area close to the driving chip area, the driving chip area is provided with:
a plurality of test pins used for transmitting a test signal, and electrically connected to second ends of the plurality of touch leads to transmit the test signal to the plurality of touch electrodes, the plurality of test pins are arranged in the first direction; and
a multiplexing circuit comprising a plurality of multiplexing input terminals and a plurality of multiplexing output terminals, wherein a number of the multiplexing input terminals is less than a number of the multiplexing output terminals; the plurality of multiplexing input terminals and the plurality of test pins are in one-to-one correspondence, the plurality of multiplexing output terminals and the plurality of touch leads are in one-to-one correspondence; each of the plurality of multiplexing input terminals is electrically connected to a corresponding test pin, and each of the plurality of multiplexing output terminals is electrically connected to a corresponding touch lead;

the wiring area is provided with:
a plurality of first control pins used for transmitting a first control signal to control a turned-on state between the plurality of multiplexing input terminals and the plurality of multiplexing output terminals, wherein the plurality of first control pins are arranged in the first direction, and a symmetry axis of the plurality of first control pins in the first direction coincides with a symmetry axis of the plurality of test pins in the first direction; and a plurality of positioning marks located on sides of the plurality of first control pins away from the plurality of test pins and used for locating the plurality of first control pins and a plurality of probes, wherein the driving chip area is further provided with a plurality of dummy pins located on a side of the plurality of test pins and a side of the multiplexing circuit which are close to the plurality of first control pins, wherein the plurality of dummy pins are arranged in a second direction perpendicular to the first direction, and each of a plurality of connection lines that are connected to one of a plurality of control terminals and a corresponding first control pin is provided between two adjacent dummy pins to prevent signal interference among the connection lines, and the wiring area is further provided with a plurality of second control pins for transmitting a second control signal, wherein the plurality of second control pins are in one-to-one correspondence with the plurality of first control pins, and an antistatic circuit is provided between the plurality of first control pins and the plurality of second control pins.

2. The display panel of claim 1, wherein the multiplexing circuit is positioned between the plurality of test pins and the plurality of touch leads, the plurality of multiplexing input terminals are arranged in the first direction, and the plurality of multiplexing output terminals are arranged in the first direction.

3. The display panel of claim 1, wherein the
control terminals are electrically connected to the plurality of first control pins to transmit the first control signal to the plurality of control terminals to control a turned-on state between the plurality of multiplexing input terminals and the plurality of multiplexing output terminals.

4. The display panel of claim 3, wherein
each of the plurality of second control pins is electrically connected to a corresponding first control pin to transmit the second control signal to the plurality of control terminals to electrically disconnect the plurality of multiplexing input terminals and the plurality of multiplexing output terminals.

5. The display panel of claim 1, wherein the driving chip area is further provided with:
a plurality of touch pin groups, wherein each of the plurality of touch pin groups comprises a plurality of touch pins for transmitting a touch signal, and wherein the plurality of touch pins and the plurality of touch leads are in one-to-one correspondence, and the plurality of touch pins are electrically connected to second ends of the plurality of touch leads to transmit the touch signal to the plurality of touch electrodes.

6. The display panel of claim 5, wherein the driving chip area is further provided with:
a plurality of data pin groups, each of the plurality of data pin groups comprises a plurality of data pins for transmitting a data signal;

wherein the plurality of data pin groups and the plurality of touch pin groups are alternately arranged in the first direction, and the plurality of data pin groups and the plurality of touch pin groups are bonded to a same driving chip to perform a transmission of the touch signal and the data signal.

7. A display panel, wherein the display panel comprises a display area and a terminal area at least on a side of the display area, the terminal area comprises a driving chip area bonded with a driving chip, and a wiring area around the driving chip area, the display area is provided with:
a plurality of touch leads and a plurality of touch electrodes, wherein first ends of the plurality of touch leads are electrically connected to the plurality of touch electrodes, the plurality of touch leads are arranged in a first direction, and the first direction is parallel to a side of the display area close to the driving chip area, and the driving chip area is provided with:
a plurality of test pins used for transmitting a test signal, and electrically connected to second ends of the plurality of touch leads to transmit the test signal to the plurality of touch electrodes, the plurality of test pins are arranged in the first direction; and a multiplexing circuit comprising a plurality of multiplexing input terminals and a plurality of multiplexing output terminals, wherein a number of the multiplexing input terminals is less than a number of the multiplexing output terminals; the plurality of multiplexing input terminals and the plurality of test pins are in one-to-one correspondence, the plurality of multiplexing output terminals and the plurality of touch leads are in one-to-one correspondence; each of the plurality of multiplexing input terminals is electrically connected to a corresponding test pin, and each of the plurality of multiplexing output terminals is electrically connected to a corresponding touch lead;

the wiring area is provided with:
a plurality of first control pins used for transmitting a first control signal to control a turned-on state between the plurality of multiplexing input terminals and the plurality of multiplexing output terminals, wherein the plurality of first control pins are arranged in the first direction, and a symmetry axis of the plurality of first control pins in the first direction coincides with a symmetry axis of the plurality of test pins in the first direction, wherein the driving chip area is further provided with a plurality of dummy pins located on a side of the plurality of test pins and a side of the multiplexing circuit which are close to the plurality of first control pins, wherein the plurality of dummy pins are arranged in a second direction perpendicular to the first direction, and each of a plurality of connection lines that are connected to one of a plurality of control terminals and a corresponding first control pin is provided between two adjacent dummy pins to prevent signal interference among the connection lines, the wiring area is further provided with a plurality of second control pins for transmitting a second control signal, wherein the plurality of second control pins are in one-to-one correspondence with the plurality of first control pins, and an antistatic circuit is provided between the plurality of first control pins and the plurality of second control pins.

8. The display panel of claim 7, wherein the multiplexing circuit is positioned between the plurality of test pins and the plurality of touch leads, the plurality of multiplexing input terminals are arranged in the first direction, and the plurality of multiplexing output terminals are arranged in the first direction.

9. The display panel of claim 7, wherein the control terminals are electrically connected to the plurality of first control pins to transmit the first control signal to the plurality of control terminals to control a turned on state between the plurality of multiplexing input terminals and the plurality of multiplexing output terminals.

10. The display panel of claim 9, wherein
each of the plurality of second control pins is electrically connected to a corresponding first control pin to transmit the second control signal to the plurality of control terminals to electrically disconnect the plurality of multiplexing input terminals and the plurality of multiplexing output terminals.

11. The display panel of claim 7, wherein the driving chip area is further provided with:
a plurality of touch pin groups, wherein each of the plurality of touch pin groups comprises a plurality of touch pins for transmitting a touch signal,
wherein the plurality of touch pins and the plurality of touch leads are in one-to-one correspondence, and the plurality of touch pins are electrically connected to the second ends of the plurality of touch leads to transmit the touch signal to the plurality of touch electrodes.

12. The display panel of claim 11, wherein the driving chip area is further provided with:
a plurality of data pin groups, wherein each of the data pin groups comprises a plurality of data pins for transmitting a data signal, and
wherein the plurality of data pin groups and the plurality of touch pin groups are alternately arranged in the first direction, and the plurality of data pin groups and the plurality of touch pin groups are bonded to a same driving chip to perform a transmission of the touch signal and the data signal.

* * * * *